US010559709B2

(12) United States Patent
Ayres et al.

(10) Patent No.: US 10,559,709 B2
(45) Date of Patent: Feb. 11, 2020

(54) MAPPING OF MEASUREMENT DATA TO PRODUCTION TOOL LOCATION AND BATCH OR TIME OF PROCESSING

(71) Applicant: Aurora Solar Technologies (Canada) Inc., North Vancouver (CA)

(72) Inventors: Gregory Ayres, San Jose, CA (US); Steven McDonald, North Vancouver (CA)

(73) Assignee: Aurora Solar Technologies (Canada) Inc., North Vancouver, BC ( * ) Notice: Subject to any disclaimer, the term of this patent is extended or adjusted under 35 U.S.C. 154(b) by 0 days.

(21) Appl. No.: 15/520,831

(22) PCT Filed: Oct. 20, 2015

(86) PCT No.: PCT/CA2015/051051
§ 371 (c)(1),
(2) Date: Apr. 20, 2017

(87) PCT Pub. No.: WO2016/061671
PCT Pub. Date: Apr. 28, 2016

(65) Prior Publication Data
US 2018/0006185 A1 Jan. 4, 2018

Related U.S. Application Data

(60) Provisional application No. 62/066,180, filed on Oct. 20, 2014.

(51) Int. Cl.
  H01L 31/18 (2006.01)
  H01L 31/04 (2014.01)
(52) U.S. Cl.
  CPC .......... H01L 31/1876 (2013.01); *H01L 31/04* (2013.01)

(58) Field of Classification Search
None
See application file for complete search history.

(56) References Cited

U.S. PATENT DOCUMENTS 6,026,881 A * 2/2000 Durso .................... G05G 15/00
                                                                     156/359
8,456,092 B2   6/2013 Knapp
(Continued)

FOREIGN PATENT DOCUMENTS

CN         1314702 A      9/2001
CN         1320950 A      11/2001
(Continued)

OTHER PUBLICATIONS

Extended European Search Report from European Patent Application No. 15851917.3, dated Mar. 13, 2018, 6 pages.
(Continued)

*Primary Examiner* — Lex H Malsawma
(74) *Attorney, Agent, or Firm* — Morgan, Lewis & Bockius LLP

(57) ABSTRACT

The present invention provides methods and systems for manufacturing process control of photovoltaic products. Some embodiments relate to a method for tracking wafers for photovoltaic products with respect to which production tool processed them and their position within that production tool. Some embodiments relate to measuring and characterizing the critical-to-quality parameters of the partially-finished photovoltaic products emerging from the production tool in question. Some embodiments relate to display and visualization of the measured parameters on a computer screen, such that the parameters of each production unit can be directly observed in the context of which production tools processed them, which location within a specific production tool they were located in during processing, and which (Continued)

batch, or in the case of continuous processing, what time, the unit(s) was/where processed.

24 Claims, 17 Drawing Sheets

(56) References Cited

U.S. PATENT DOCUMENTS

| | | | |
|---|---|---|---|
| 2008/0306621 A1 | 12/2008 | Choi et al. | |
| 2011/0188733 A1* | 8/2011 | Bardos | G01N 21/6489 382/149 |
| 2012/0136470 A1* | 5/2012 | Deans | G05B 19/41875 700/110 |
| 2013/0004339 A1 | 1/2013 | Eisfelder et al. | |

FOREIGN PATENT DOCUMENTS

| | | |
|---|---|---|
| CN | 1769920 A | 5/2006 |
| CN | 101681161 A | 3/2010 |
| CN | 102449786 A | 5/2012 |
| CN | 101861643 B | 11/2012 |
| DE | 10 2011 056404 A1 | 6/2013 |
| TW | 200425320 | 11/2004 |
| WO | WO-01/97902 A2 | 12/2001 |
| WO | WO-2007/035199 A2 | 3/2007 |
| WO | WO-2010/132998 A1 | 11/2010 |
| WO | WO-2011/094592 A1 | 8/2011 |
| WO | WO-2013/105922 A2 | 7/2013 |
| WO | WO-2016/061671 A1 | 4/2016 |

OTHER PUBLICATIONS

International Search Report and Written Opinion from published International Application No. WO 2016/061671, dated Dec. 22, 2015, 8 pages.
"Statistics in Industry," Jul. 18, 2013, Elsevier ISBN: 9780444506146, vol. 22, pp. 479-481.
European Office Action from European Patent Application No. 15851917.3, dated Jan. 22, 2019, 4 pages.
"Handbook of Statistics 22—Statistics in Industry," Elsevier Science BV, Jul. 2013, vol. 22, Chapter 10, Statistics in the Semiconductor Industry, pp. 459-498.
Taiwanese Office Action from Taiwanese Patent Application No. 104134234, dated Jun. 24, 2019, 6 pages (including English language translation).
V. Czitrom, "Statistics in the Semiconductor Industry," Handbook of Statistics, Jan. 2003, pp. 459-498, vol. 22, Elsevier Science B.V.
J. Pak et al., "Advanced Methods for Analysis of Wafer-to-Wafer Yield Variation," Advanced Micro Devices, Submicron Development Center, 1997, pp. 62-66, IEEE.
Office Action issued in European Application No. 15851917.3, dated Nov. 26, 2019.
Office Action issued in Chinese Application No. 201580067881.1, dated Nov. 28, 2019.

* cited by examiner

MAPPING OF MEASUREMENT DATA TO PRODUCTION TOOL LOCATION AND BATCH OR TIME OF PROCESSING

FIELD OF THE INVENTION

The present invention pertains to the field of Photovoltaic ("PV") products and their manufacture and, in particular, to means of displaying and controlling the performance of production tools by using measurements of critical-to-quality parameters of the partially-finished goods after processing by the production tools.

BACKGROUND

Photovoltaic ("PV") products and devices directly convert absorbed illumination to electrical energy with the advantage of being non-polluting and silent in operation. They are readily adapted to either a centralized or distributed power generating system and as such, are an attractive alternative to fossil fuels and nuclear power sources.

An overall need in the PV industry is to reduce the cost of manufactured PV products sufficiently to achieve product profitability at highly competitive pricing. For wafer, cell and module manufacturers, this drive for cost reduction has three aspects: improved product technology (so-called "high-efficiency" products), providing higher power output for a given market price; reduced per-unit cost of materials and capital equipment through economies of scale; and improved manufacturing efficiency and yield. In particular, current manufacturing processes are subject to improvement for example by the further provision of tools for process monitoring and optimization.

Therefore there is a need for quality control methods and systems for photovoltaics and similar silicon wafer-based products that is not subject to one or more limitations of the prior art.

This background information is provided to reveal information believed by the applicant to be of possible relevance to the present invention. No admission is necessarily intended, nor should be construed, that any of the preceding information constitutes prior art against the present invention.

SUMMARY OF THE INVENTION

An object of the present invention is to provide methods and systems for quality monitoring during production of silicon cells for use in photovoltaic products. In accordance with an aspect of the present invention, there is provided a method for quality monitoring during production of silicon cells for use in photovoltaic products, the method comprising: measuring characteristics of silicon wafers following production operations, said production operations including treatment by a production tool; determining a spatial order, temporal order, or both spatial order and temporal order of the silicon wafers within the production tool during treatment; and providing a graphical display of information based on the measured characteristics of the silicon wafers, said information spatially arranged on the graphical display according to the spatial order, temporal order, or both spatial order and temporal order.

In accordance with another aspect of the present invention, there is provided a system for quality monitoring during production of silicon cells for use in photovoltaic products, the system comprising: a wafer measurement module configured to measure characteristics of silicon wafers following production operations, said production operations including treatment by a production tool; a wafer tracking module configured to determine a spatial order, temporal order, or both spatial order and temporal order of the silicon wafers within the production tool during treatment; and an operator interface module configured to provide a graphical display of information based on the measured characteristics of the silicon wafers, said information spatially arranged on the graphical display according to the spatial order, temporal order, or both spatial order and temporal order.

In accordance with another aspect of the present invention, there is provided a method for quality monitoring during production of silicon cells for use in photovoltaic products, the method comprising: measuring parameters of silicon wafers following production operations, said production operations including treatment by a production tool; correlating the measured parameters of each of the silicon wafers with a time of treatment by the production tool, a corresponding location of each of the silicon wafers within the production tool during treatment, or a combination thereof; correlating the measured parameters of each of the silicon wafers with aspects of the production operations, said aspects including one or both of processing time and processing location within the production tool, thereby determining operating characteristics of the production tool; and displaying the determined operating characteristics of the production tool for use in quality monitoring. The production tool may be a batch production tool or an inline production tool, for example.

In accordance with another aspect of the present invention, there is provided a system for quality monitoring during production of silicon cells for use in photovoltaic products, the system comprising: a wafer measurement module configured to measure parameters of silicon wafers following production operations, said production operations including treatment by a production tool; a wafer tracking module configured to correlate said parameters of each of the silicon wafers with a time of treatment by the production tool, a corresponding location of each of the silicon wafers within the production tool during treatment, or a combination thereof; a production performance monitoring module configured to correlate the measured parameters of each of the silicon wafers with aspects of the production operations, said aspects including one or both of processing time and processing location within the production tool, thereby determining operating characteristics of the production tool; and an operator interface module configured to display the determined operating characteristics of the production tool for use in quality monitoring. The production tool may be a batch production tool or an inline production tool, for example.

DETAILED DESCRIPTION OF THE INVENTION

Definitions

Figure 1:
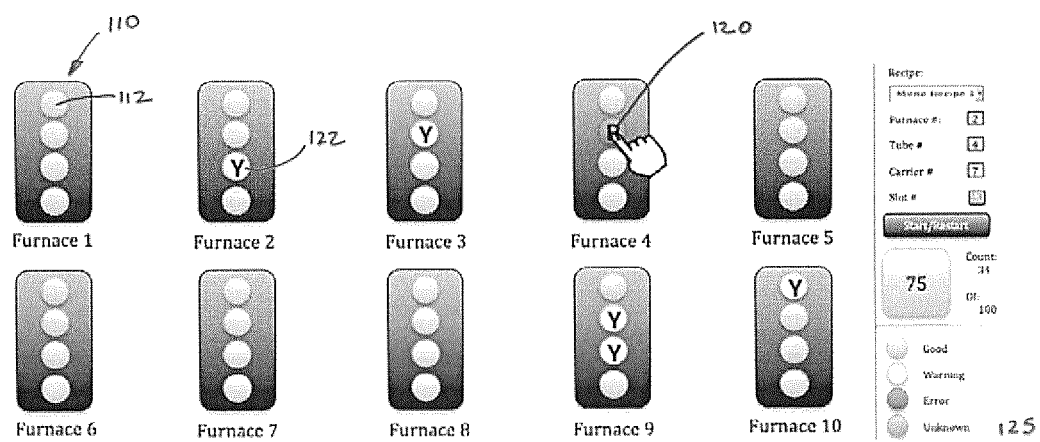
FIG. 1 illustrates an example of a production tool status information display according to embodiments of the present invention.

The term "boat" refers to a specialized wafer carrier (typically made of quartz) that is used to hold wafers during high-temperature processing within a diffusion furnace.

The term "CTQ parameters" refers to "Critical To Quality" or "CTQ" parameters, which can be parameters directly related to the production step immediately preceding measurement, parameters related to other production steps prior to this immediately preceding step, or raw material properties. Examples of some CTQ parameters in PV cell production are: Maximum, minimum and average emitter sheet resistance per wafer after one or more emitter fabrication steps; Emitter sheet resistance uniformity per wafer after one or more emitter fabrication steps; Average bulk sheet resistance per wafer; Bulk sheet resistance variation by location on a wafer; Average carrier lifetime per wafer; Carrier lifetime variation by location on a wafer; Average wafer color or passivation layer thickness after passivation layer deposition; and Variation of wafer color or passivation layer thickness after passivation layer deposition.

The term "operator" refers to a trained individual responsible for day-to-day monitoring and standard operation of production tools and/or defined manual procedures in the production line.

The term "process (or manufacturing) engineer" refers to a trained individual responsible for ensuring the proper operation of the manufacturing processes in a production line. Often possesses a Bachelor's degree or higher in an engineering discipline, and is capable of sophisticated diagnosis of production issues and can make process changes.

The term "production step" refers to one of a multiplicity of steps in the conversion of incoming raw material to finished goods. Often accomplished using a Production Tool.

The term "production tool" refers to a device that performs a treatment or process on WIP units to progress them from an unfinished state to another state that is closer to their targeted finished state.

The term "wafer" refers to a substrate for a photovoltaic or "solar" cell. A wafer is typically made from crystalline silicon, but may also be composed of other materials, including (non-exclusively) various semiconductors and glasses.

The term "wafer carrier" refers to a box, cassette or other device for holding multiple wafers.

The term "WIP" refers to "Work In Progress," for example, a solar cell (wafer) that is not yet in its finished state. As will be readily understood, a wafer is processed into a cell via a series of steps, and may be referred to during this series of steps by a variety of terms such as WIP, wafer, or cell, depending on context.

As used herein, the term "about" refers to a +/−10% variation from the nominal value. It is to be understood that such a variation is always included in a given value provided herein, whether or not it is specifically referred to.

Unless defined otherwise, all technical and scientific terms used herein have the same meaning as commonly understood by one of ordinary skill in the art to which this invention belongs.

In bulk manufacturing, certain steps can take longer than others. In order to avoid process gates, the longer steps can be parallelized. To mitigate equipment cost increases due to parallelization, process equipment can be designed to accept multiple products at once, i.e. batches of products, or multiple instances of parallel process equipment can share at least some components. In either case, certain common resources are divided up for processing multiple products concurrently. When this division is potentially uneven, quality control challenges arise which should be mitigated.

Embodiments of the present invention provide for a production line method and system for tracking, measuring, displaying and controlling production steps during device fabrication which potentially enhances production step and/or raw material fault detection and diagnosis. This may provide for silicon wafer batch quality monitoring with spatial-temporal tracking and/or quality control methods and systems for photovoltaic manufacturing incorporating batch production steps. Various embodiments may be used to enable a tighter degree of process step control than is generally currently available, and/or to enable production process optimization by providing detailed information about the performance of production tools both in terms of locations in the tools, and variations over time. These and other potential advantages of the present invention will be readily apparent from the drawings, discussion and description that follow.

Embodiments of the present invention relate to a method and system for tracking wafers with respect to which production tool processed them and their position within that production tool. This may apply particularly to batch production tools in which multiple wafers are processed at the same time. Batch production tools may include batch diffusion furnaces, anti-reflective coating tools, wet chemistry systems processing wafers in parallel, or the like.

Embodiments of the present invention relate to a method and system for measuring and characterizing the critical-to-quality (CTQ) parameters of the partially-finished PV goods (or Work In Progress (WIP)) emerging from the production tool in question. Characteristics of the wafers may be measured, such characteristics referring to various measurables such as CTQ parameters or characteristics indicative of CTQ parameters.

Embodiments of the present invention relate to method and system for display and visualization of the CTQ parameters on a computer screen or other appropriate visual output, such that the CTQ parameters of each WIP unit can be directly observed in the context of which production tools processed them, which location within a specific production tool they were located in during processing, and which batch, or in the case of continuous processing, what time, the unit(s) was/were processed. The CTQ parameters may be displayed in a manner leading to ready visualization by an operator. For example, the spatial arrangement of displayed CTQ parameters, each of which is specific to a particular wafer or wafer location, may correlate in a known way to the spatial arrangement of wafers in a batch, or to the spatial arrangement of wafer locations.

Tracking Wafers

For the purposes of the present invention, wafer tracking refers to the ability to associate a particular wafer or a group of wafers with certain data concerning the time and location of their processing in a particular process step. The specific data may include but are not necessarily limited to the following. The data may include which production tool the wafer or wafer group came from. This is particularly the case when there are multiple production tools used in a particular production step, for example multiple tools operating in parallel. The data may include the location of each wafer or wafer group in the production tool, for example when the production tool employs batch production. The data may include the time that they were processed by the tool, and/or their batch number. The data may include wafer orientation within the production tool. For example, the wafers can either face the load or gas end in a batch diffusion furnace. The data may include production tool conditions and process variables used during the processing of the wafers at that time and location in the tool. The data may include a production recipe, for example specifying particular parameters of materials and/or processes related to the production. In the event that WIP units are produced with multiple recipes (for example mono, multi, SE, etc.), it may be important to know what recipe is active before CTQ measurement occurs.

Additionally, the above-mentioned location information may include one or more of the following, as appropriate. The location information may include the processing chamber ("tube" in a batch diffusion furnace) in a multi-chamber production tool. The location information may include whether or not carriers are used in the processing tool (e.g. quartz boats in a batch diffusion furnace), and if so, an identification of the carrier. The location information may include the wafer or wafer group's position in a production tool chamber such as a chamber of a batch diffusion furnace. This may be in the form of a Cartesian coordinate, numeric count of position out of a predetermined discrete number of available positions, or the like. In the case of a batch diffusion furnace, the location may be represented by a one-dimensional linear figure. In the case of an anti-reflective coating tool or other tool allowing for two-dimensional arrangement of wafers, the location may be represented by a two-dimensional (x,y) figure. In the case of an inline production tool such as a wet etching system, the location may be represented by a linear figure representing a "lane" in the tool. One potentially appropriate inline production tool is the InTex® system from Rena GmbH. Inline production tools incorporating multiple parallel "lanes" each for serial processing of a wafer may, in one embodiment, be regarded similarly to batch production tools in the sense that the collection of wafers in all lanes and flowing through a specified portion of the production tool during a specified time interval may be regarded for some purposes of the present invention as a batch.

By way of example, three particular approaches for utilizing the above-described data are described below.

In the first method, wafers are unloaded from a production tool and made available for measurement by either (a) removing the carriers containing the wafers directly from the production tool; or (b) transferring the wafers from a production tool carrier to one or more other wafer carriers. This latter case is usually found when unloading a diffusion furnace or certain chemical vapour deposition tools. During the unloading, the time and location data of the wafers, as listed above, is recorded in a measurement database and associated with a unique identifier for each carrier (the carrier ID) used. The order of wafers in each carrier is also cross-referenced to the ordering in the wafer position data, as indicated in the location data as specified above.

The carriers are then made available to automated handling equipment that indexes out the wafers one-by-one from the carrier, preserving their order. The CTQ parameters (or other characteristics) of the wafers are then measured. As each carrier is made available for indexing out the wafers, its carrier ID is provided to the measurement database, which, as indicated above, is cross-referenced to the time and location data of the wafers in that carrier. As, or after, the wafers are measured, their CTQ parameters are associated with their time and location data.

Entry of location and time data, and carrier ID, into the measurement database can be done in the following ways, none of which are mutually exclusive, and which may be used in combination: manual entry into a data-fill area on a computer screen; automatic entry, via data communications from another system that already has this information; and by reading RFID tags or markings on the carriers, stack boxes or wafers. These markings may be bar-codes, data matrix codes, or another way to uniquely identify the unit in question.

In the second method, during unloading from, or as a configuration of, the production tool, wafers are presented on a conveyor in a known and reproducible manner. Wafer order is thereby preserved so that their production tool location information can be determined by the order in which they appear on the conveyor. In the case of a batch production tool, this is a function of the unloading sequence and mechanical wafer handling configuration. The time and location data can therefore be inferred from the time that the wafers pass along the conveyor. The information needed to make this inference may be production line specific and may be entered into a configuration database associated with the measurement database. In the case of an in-line production tool, the sequence of wafers (and which lane they are in) provides the required time and location information.

In the third method, each wafer is identified by a unique marking, or by recognition of substantially unique patterns on or in the wafer, such as grain patterns in a multicrystalline wafer. During loading of the production tools, each wafer is identified and its target location is recorded in the measurement database. No further tracking is required until the CTQ parameters are measured, at which time the wafer is also identified through recognition of its marking or pattern. Similarly to the first method, as, or after, the wafers are measured, their CTQ parameters are then associated with their time and location data.

In various embodiments, therefore, wafers may be tracked by an identifier that is physically associated with the wafer and which is recorded at two or more stages of the production process. Additionally or alternatively, wafers may be moved through the process in a known deterministic manner, and may be tracked by consideration of this movement through the process. For example, given a wafer at a certain location and time, backwards extrapolation of the process may be employed to infer a prior location and time of the wafer, and hence which production tools were employed in its production and its location within the production tool in the case of a batch process. The wafer production process may be configured to correspond with a deterministic dynamical system, such that trajectories of a given wafer through the process can be reliably determined.

Although production operations which preserve the ordering of the wafers is mentioned above, in some embodiments, rather than preserving the order of the wafers, the wafers may be mixed at one or more stages into a new order in a known reversible way, such that each position in the new order can be unambiguously associated with a position in the original order. In this way, CTQ measurements may be unambiguously mapped back to the original wafer order in the carrier. Even when wafers are split into multiple process branches and handled by separate equipment, the original ordering may be reconstructable provided that the process is sufficiently deterministic and monitored, and no random or extraneous reordering occurs. However, it is desirable that the wafer ordering be robust to random fluctuations such as a wafer removal, and hence in various embodiments it may be desirable to minimize reordering. Preserving the original ordering of the wafers may be one robust method for accomplishing this. Another robust method may be the third method described above.

Alternatively, in some embodiments at least a limited amount of reordering may be introduced in order to facilitate troubleshooting. For example, two batches of wafers produced by a first process step may be intermixed prior to carrying out a second process step. The intermixing may involve moving at least one wafer from the first batch to the second batch and vice-versa. The two batches may undergo the first process step at different times and/or using different instances of the process equipment for carrying out the first process step. The two batches may undergo the second process step at different times and/or using different instances of the process equipment for carrying out the second process step. As such, for example, if some but not all of the wafers of the first batch are found defective after the second process step, then the route of the defective wafers through the first and second process steps can be retraced to determine where the defect originated, and the route of the non-defective wafers through the first and second process steps can be retraced to determine locations at which the defect was unlikely to originate. Combining this information may lead to a better understanding of how the defect was injected into the overall process.

In some embodiments, the third method may be combined with the first or second method. For example, wafer order may be preserved as much as possible, and every $n^{th}$ wafer may be identified with a unique marking. If the number of wafers between subsequent marked wafers changes, then the removal of an intermediate unmarked wafer may be inferred.

Display of Information

Embodiments of the present invention include displaying information to an operator, maintenance worker, engineer, or the like. The information may relate to one or more aspects of the wafer production process such as wafer quality, production tool operational status, or statistics, trends or other data obtained from processing the acquired information.

In various embodiments the information displayed and its intended usage comprises one or more aspects described as follows. CTQ parameters per wafer by production tool, location and time or batch may be displayed. This is intended to provide operators and process engineers with easily interpreted information about the status and performance of the production tool in its various locations (for example by tube, or by position in a tube). Further, the above-mentioned status or performance can be for a specific batch or point in time, or over a range of times or batches. Further, in either point-in-time or time-range modes of observations, the operators and process engineers can observe production tool faults, variations of produced CTQ parameters by location (and time, as applicable) and trends such as long-term CTQ parameter drift. Further, changes in CTQ parameters due to raw material changes or changes in prior production steps may also be observed by the measured patterns evident in the production tool locations and time or batch.

In some embodiments, for the production tools used at a particular production step, the status of each tool, and the chambers in each tool are displayed as an array of icons. Each icon may have a specific shape, color or other mode of display that indicates whether a number or pattern of the CTQ parameters for the wafers processed in that tool or chamber are within or exceed certain bounds, such as quality control bounds.

An example of a production tool status information display is illustrated in FIG. 1. The icons are the objects that look like traffic lights 110—each one represents a production tool and the circles 112 inside each one represent the tool's chambers. In this example, the icons may be distinguished by color. However, for purposes of clarity of presentation of the figure in greyscale, the color of the red and yellow icons is emphasized by the use of "R" 120 and "Y" 122 symbols, respectively. Incidentally, the sole "red" icon is pointed to by the mouse "hand" cursor for additional clarity. The remaining icons are coloured green, except for the "unknown" 125 icon which may be another color, such as blue.

Another display provided in accordance with embodiments of the present invention is configured to provide more information for each production tool chamber. This information is graphically arranged and displayed as follows. A two-dimensional matrix of icons is displayed, where one axis is time or batch number, and the other axis is position within the chamber. In cases where specifying chamber position requires two or more dimensions, 3D plots may be used to illustrate the measurement data. Alternatively, a series of two-dimensional plots may be used. Further, each icon may have a specific shape, color or other mode of display that indicates whether the CTQ parameters for that wafer or group of wafers are within or exceed certain predetermined bounds. Further, where multiple CTQ parameters are measured, the specific parameters to be displayed may be explicitly selected.

Figure 2:
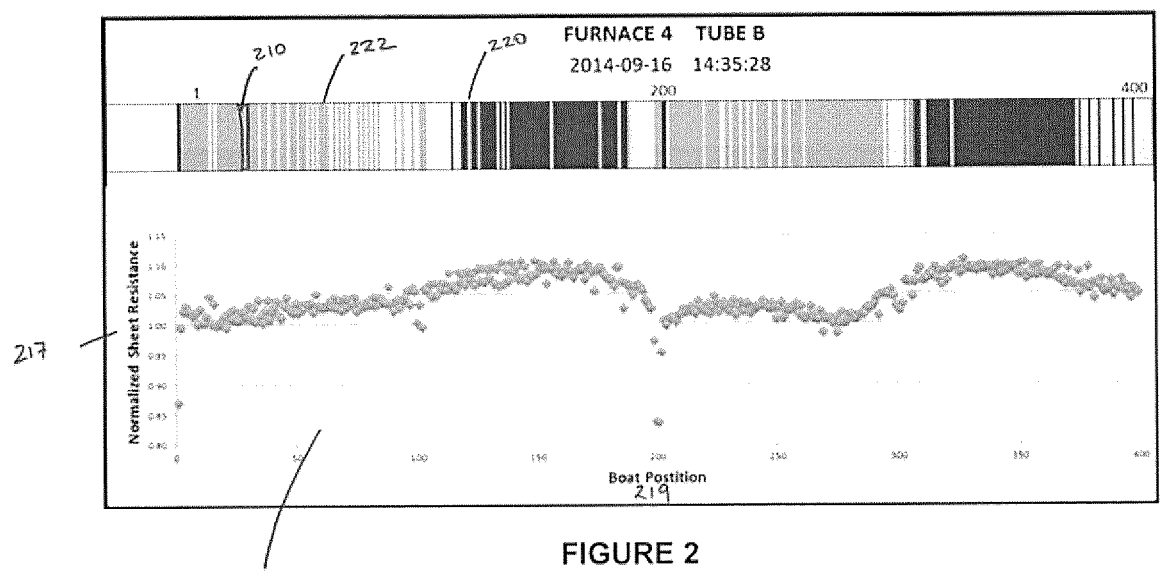
FIG. 2 illustrates an example of a production tool chamber information display according to embodiments of the present invention.

An example of a production tool chamber information display is illustrated in FIG. 2. The icons are the small differently shaded rectangles 210 above the plot 215 of sheet resistance 217 versus boat position 219. Each rectangle represents a wafer and its CTQ parameters compared to target. In this example, the icons may be distinguished by color; green within limits, yellow outside control limits and red outside specification limits. However, for purposes of clarity of presentation of the figure in greyscale, the color yellow is represented by the lightest shaded rectangles, the color red is represented by the darkest shaded rectangles 220, and the color green is represented by the moderately shaded rectangles 222. Also plotted 215 along with the diagram of actual CTQ parameters compared to specification limits is the individual CTQ measurements mapped to the boat position within the production tool.

Thus, some embodiments of the present invention comprise providing a graphical display indicative of wafer process quality via a graphic which displays a plurality of quality indicators each corresponding to a wafer. The quality indicators may be coloured rectangles or boxes having a color which indicates whether a CTQ measurement of the corresponding wafer is within or outside of predetermined quality control limits. The quality indicators are arranged spatially on the display in an order which corresponds to a spatial ordering of the wafers, for example the ordering corresponding to relative wafer locations within a batch production tool. The order may be a one-dimensional spatial ordering for example within a boat, a two-dimensional spatial ordering, or a three-dimensional spatial ordering. Furthermore, one dimension of spatial arrangement of the quality indicators on the display may correspond to a temporal ordering of the wafers, for example subsequent rows, columns or layers of displayed quality indicators may correspond to subsequent batches of wafers passed through a stage of the process, such as through a batch production tool. Quality may be conveyed by features of an icon, such as color, shape and/or size of the icon.

Figure 3:
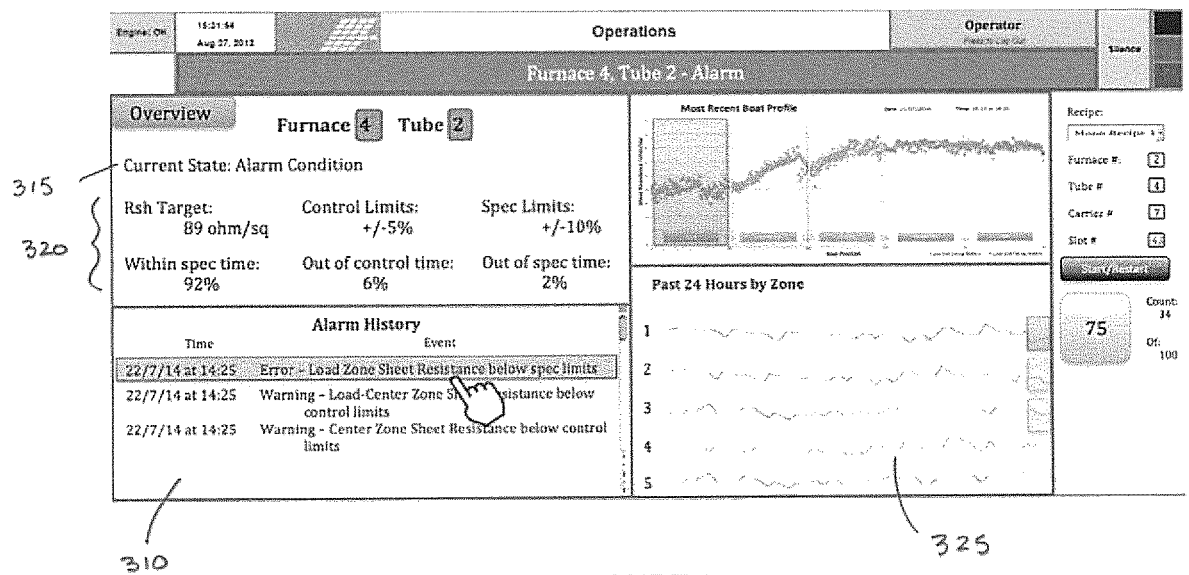
FIG. 3 illustrates an example detailed display showing the CTQ parameters in a particular batch or time range according to embodiments of the present invention.

Within each chamber, more detail can be provided by explicitly showing the CTQ parameters in a particular batch or time range, in the same positional context as the display above. An example of this detailed display is shown in FIG. 3, which illustrates an example of detailed chamber information. For example, alarm history 310, current state 315, performance metrics 320 and CTQ measurement history per zone 325 may be displayed.

Figure 4:
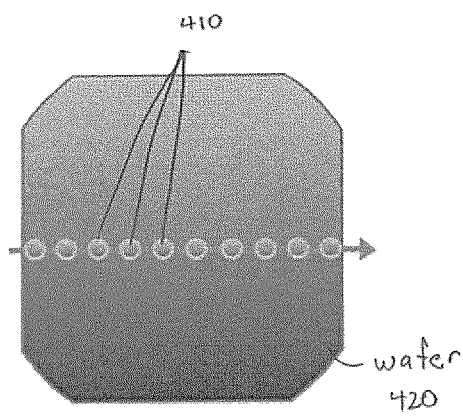
FIG. 4 illustrates a display of circles which correspond to measurements of CTQ parameters at multiple positions across the wafer, in accordance with embodiments of the present invention.
Figure 5:
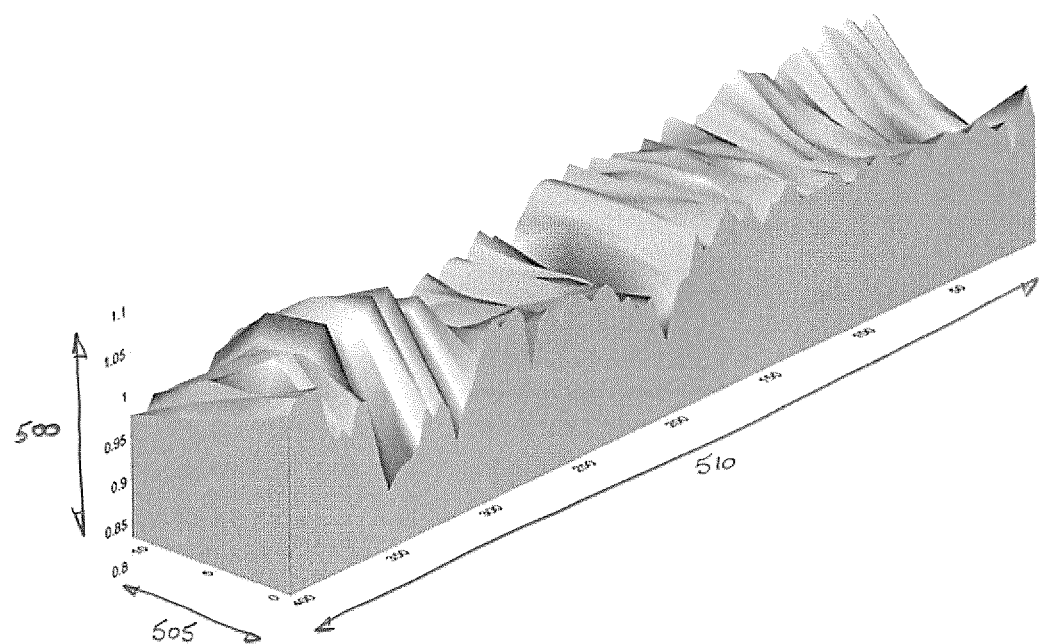
FIG. 5 illustrates a display of spatially resolved measurements taken across 400 positions within the tool in accordance with embodiments of the present invention.

In various embodiments, the measurement system is capable of measuring CTQ parameters at multiple positions across the wafer, corresponding to the circles 410 shown in FIG. 4. These measurements across the wafer 420 are mapped to the 400 positions within the tool and displayed in FIG. 5 to characterize the performance of the tool by displaying the non-uniformity of CTQ parameters across the wafer (e.g. 10 points) and across the tool (e.g. 400 points). FIG. 5 illustrates wafer uniformity across a tool with 400 locations. More particularly, the vertical 'z' axis 500 in FIG. 5 corresponds to measurement values, the shorter 'x' axis 505 corresponds to the measurement position across a wafer, and the longer 'y' axis 510 corresponds to the position of the wafer within the tool. The displayed surface in FIG. 5 may further be color coded, for example to indicate problem areas in red, less severe or potential problem areas in yellow, and non-problem areas in green. This is a particular manner of characterizing performance of a tool by measuring across the entire wafer, mapping each wafer to its position in a tool, and visualizing the performance of the tool from end to end. Thus, in some embodiments, in addition to or alternatively to displaying quality indicators each indicative of a quality parameter of a wafer, quality indicators may be displayed which are indicative of a quality parameter of a portion of a wafer.

In various embodiments, a display of information may convey data in up to three apparent spatial dimensions (using three-dimensional perspective on a two-dimensional video display). Additionally, variations in data may be conveyed by the use of color. Additionally, variations in data may be conveyed via the use of multiple graphics and/or animation. Each of the spatial dimensions, color variation schemes, multiple graphics and animation may be referred to as a dimension. Generally, some of these dimensions are used for conveying CTQ parameters, and some are used for conveying wafer spatial position within a batch and/or spatial location on a wafer (when multiple readings are taken for the same wafer). Some of these dimensions may optionally be used for conveying temporal information when a history is viewed.

Embodiments of the present invention include using a plurality of data points to monitor status of a system for producing silicon cells for use in photovoltaic products. The plurality of data points can correspond to measured characteristics of a plurality of silicon wafers being treated by the production system. Moreover, the plurality of data points can correspond to plural locations of a batch production tool at which silicon wafers can be treated concurrently. The plurality of data points can correspond to measured characteristics, such as CTQ parameters, of a corresponding plurality of silicon wafers treated as a batch by the batch production tool. The spatial locations of the silicon wafers in the batch can be correlated to the measured characteristics. The spatial variation of the measured characteristics can be used as an indication of current performance of the batch production tool. Potential faults within the batch production tool can be diagnosed by determining the spatial location or locations of measured characteristics which are out of spec.

System Implementation

Various embodiments of the present invention relate to a quality control system for use in a photovoltaic manufacturing environment. The system may comprise a combination of modules such as: wafer identification modules; wafer tracking modules; wafer measurement modules; production performance monitoring modules; operator interface modules; and production tool interface modules, as discussed below. Different embodiments of the system may incorporate different numbers and types of these modules. Various modules may be operatively coupled via wired or wireless electronic communication interfaces, for example. Each module may include a microprocessor operatively coupled to memory, the microprocessor configured to carry out program instructions stored in the memory. At least some modules may include hardware for interfacing with wafers, such as scanning equipment.

The wafer identification module is configured to identify particular wafers at various steps in the production process, such as measurement steps and/or production steps. This may be by barcode, intrinsic identifiable features of the wafer, manual entry of an identifier, or the like. The wafer identification module is configured to pass digital information indicative of identified wafers to the wafer tracking module. Plural wafer identification modules may be provided for association with plural measurement and/or production steps. The wafer identification module comprises input electronics for receiving the wafer identification information, such as a barcode scanner, along with digitization and communication electronics for encoding and communicating the wafer identification information to other components of the system. Alternatively to a barcode scanner, a machine vision system may be provided for discerning intrinsic grain patterns in wafers in order to substantially uniquely identify the wafers. Where motion of wafers through the production process can be reliably determined through prediction and modeling, some or all of the wafer identification modules may be omitted.

The wafer tracking module comprises a computing system configured to receive input from wafer identification modules and to record and track motion of wafers through the production process. A series of production locations visited by the wafer, such as visits to particular production tools and measurement sites, and related information such as visit times, associated batch information, physical location of the wafer within a batch, measurement values, and the like, may also be tracked. Additionally or alternatively, the wafer tracking module may be configured to infer a given wafer's past and/or future positions within the production process, including times processed by batch production tools and locations within such batches. Such inference may not require input from wafer identification modules but rather may be made based on a model of process dynamics. The wafer tracking module is configured to associate wafer processing operations and conditions with wafer measurement operations and measurements. For example, the wafer tracking module may associate the time that a wafer was loaded into a batch production tool as well as the relative location of that wafer in that tool, with subsequent CTQ measurements taken for that wafer. The wafer tracking module may include a computer operating a database, for example. The wafer tracking module may track and provide an indication of wafer spatial location within batch processing tools.

The wafer measurement module comprises measurement devices such as but not necessarily limited to devices for measuring sheet resistance and/or other CTQ parameters. Such modules are configured to measure wafer characteristics and transmit a signal to the system, such as to the wafer tracking module, indicative of same. The measurement devices may be electronic devices configured to automatically obtain and convey measurements, as would be readily understood by a worker skilled in the art. The wafer measurement module may comprise measurement equipment, a microprocessor operatively coupled to memory and configured to perform control and processing functions, and a communication interface for communicating with other modules.

The production performance monitoring module is configured to utilize recorded measurements of specified wafers, for example as retrieved from the wafer tracking module and measurement module, to monitor performance and past/current condition of one or more associated production tools. For example, CTQ parameter measurements for a batch of wafers or a series of wafer batches processed by a particular batch production tool may be selected, retrieved and processed by the production performance monitoring module, in order to produce an indicator of wafer quality as a function of physical location in a batch and/or as a function of batch production time. Moreover, the wafer quality and distribution thereof may be used to infer operating characteristics of the batch production tool, including any faults or defects thereof. The production performance monitoring module comprises a computer configured to process measurement data, tracking data, and the like, in a particular manner as described herein in order to derive such indicators. A communication interface for communicating with other modules may also be provided.

The operator interface module is configured to interactively display output of the production performance monitoring module. This may include a visual computer display along with user inputs for manipulating the display to show selected data to an operator. The operator interface module includes a computer which is configured to manipulate the visual display and acquire and present the desired data appropriately.

The production tool interface module, which may not be present in all embodiments, is configured to retrieve parameters or reports directly from various production tools, such as oven temperature, production tool status, alarms, and the like, and report same to the production performance monitoring module and/or operator interface module to enhance information presented thereto. The production tool interface module may comprise sensors and/or other interface configured to obtain data from the production tool, as well as an electronic communication interface for conveying information to the monitoring module, as would be readily understood by a worker skilled in the art.

Figure 6:
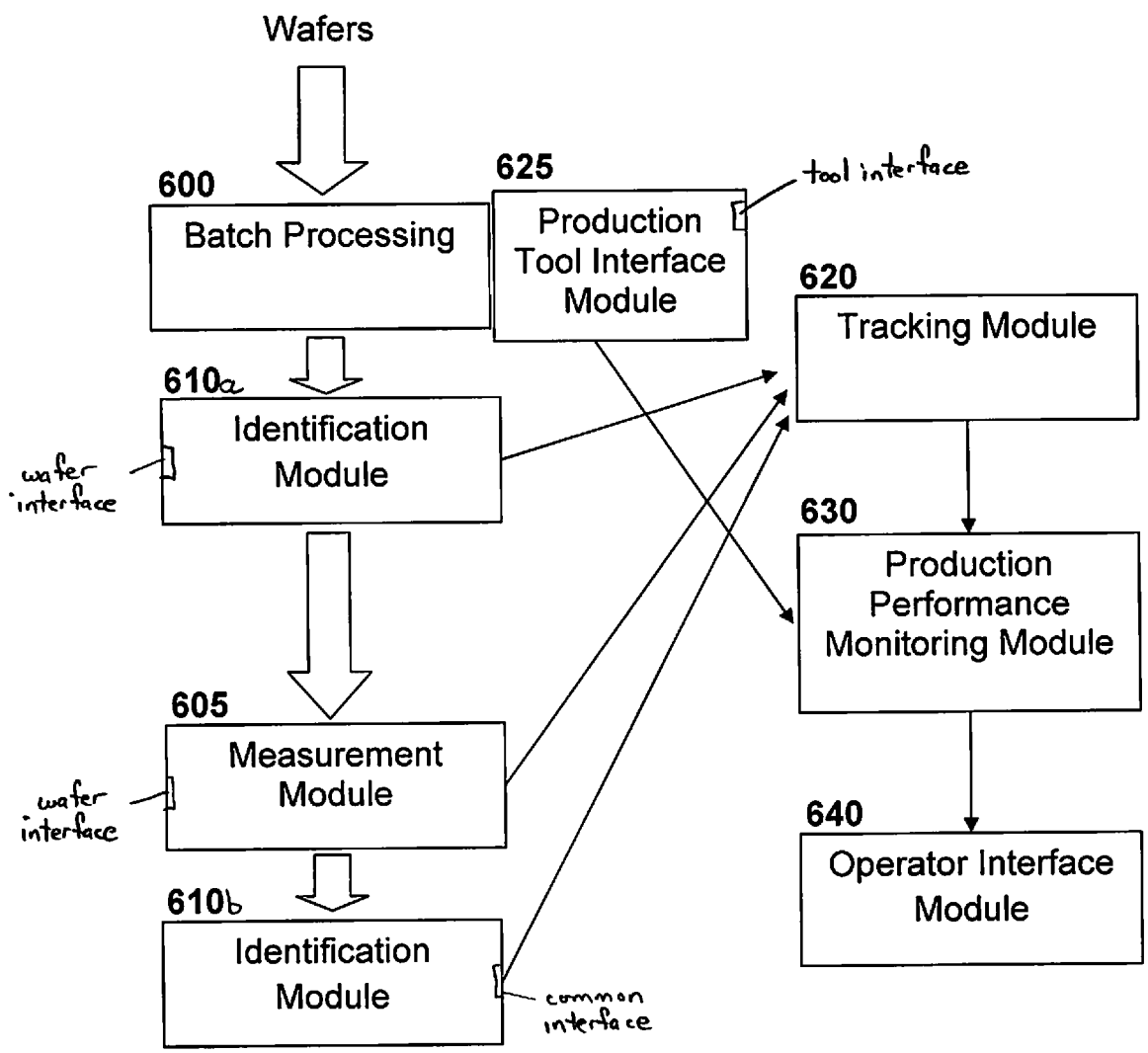
FIG. 6 illustrates a system in accordance with the present invention.

FIG. 6 illustrates a system provided in accordance with one embodiment of the present invention in which wafers are handled in batches by at least one batch production (processing) tool 600. The system comprises a measurement module 605 for measuring one or more characteristics of wafers following certain production steps including processing by the batch production tool 600. The system may comprise one or more wafer identification modules 610*a*, 610*b* for assisting in identifying wafers as they proceed through the production system if a closed-loop tracking methodology is used. As illustrated, a first wafer identification module 610*a* may be used for identifying wafers immediately before, during or after handling by the batch production tool 600, and a second wafer identification module 610*b* may be used for identifying wafers immediately before, during or after handling by the measurement module 605.

The system further comprises a wafer tracking module 620 which may be operatively coupled to the wafer identification modules, if present. The wafer tracking module is configured to associate wafer load times into the batch production tool 600 and locations within the batch production tool with measurements of those wafers taken by the measurement module 605. The system further comprises a production performance monitoring module 630 operatively coupled to the wafer tracking module 620 and an operator interface module 640 operatively coupled to the production performance monitoring module 630, both as described above. A production tool interface module 625 operatively coupled to the batch production tool 600 and to the production performance monitoring module 630, also operating as described above.

The invention will now be described with reference to specific examples. It will be understood that the following examples are intended to describe embodiments of the invention and are not intended to limit the invention in any way.

EXAMPLES

The present example relates to measurement and process step optimization. Key output attributes are measured at each process stage and data is present in context of the process elements that impact the attributes using an easy to understand operational tool. This facilitates timely identification and addressing of issues, characterization of the process and potentially tighter control.

A typical batch diffusion process for photovoltaics may employ about 200 temperature controls from 10 furnaces, times 4 tubes per furnace, times 5 temp zones per tube results, as well as about 40 gas flow and pressure controllers. This diffusion process requires measurement. Challenges include that: raw material shifts may demand dynamic adjustments to furnace recipes, diffusion processes may not be uniform across the tubes, and heaters and tube seals may fail and gas flow bubblers and gas exits plug.

Figure 7:
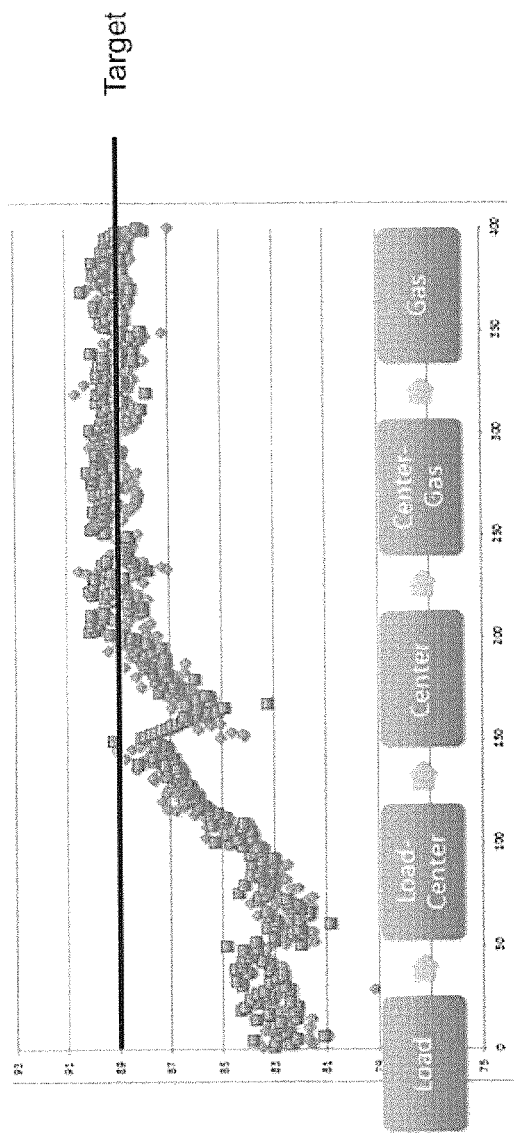
FIG. 7 illustrates a furnace batch with process control issues, namely significant variation within the furnace batch in accordance with embodiments of the present invention.

FIG. 7 illustrates a furnace batch with process control issues, namely significant variation within the furnace batch.

Figure 8:
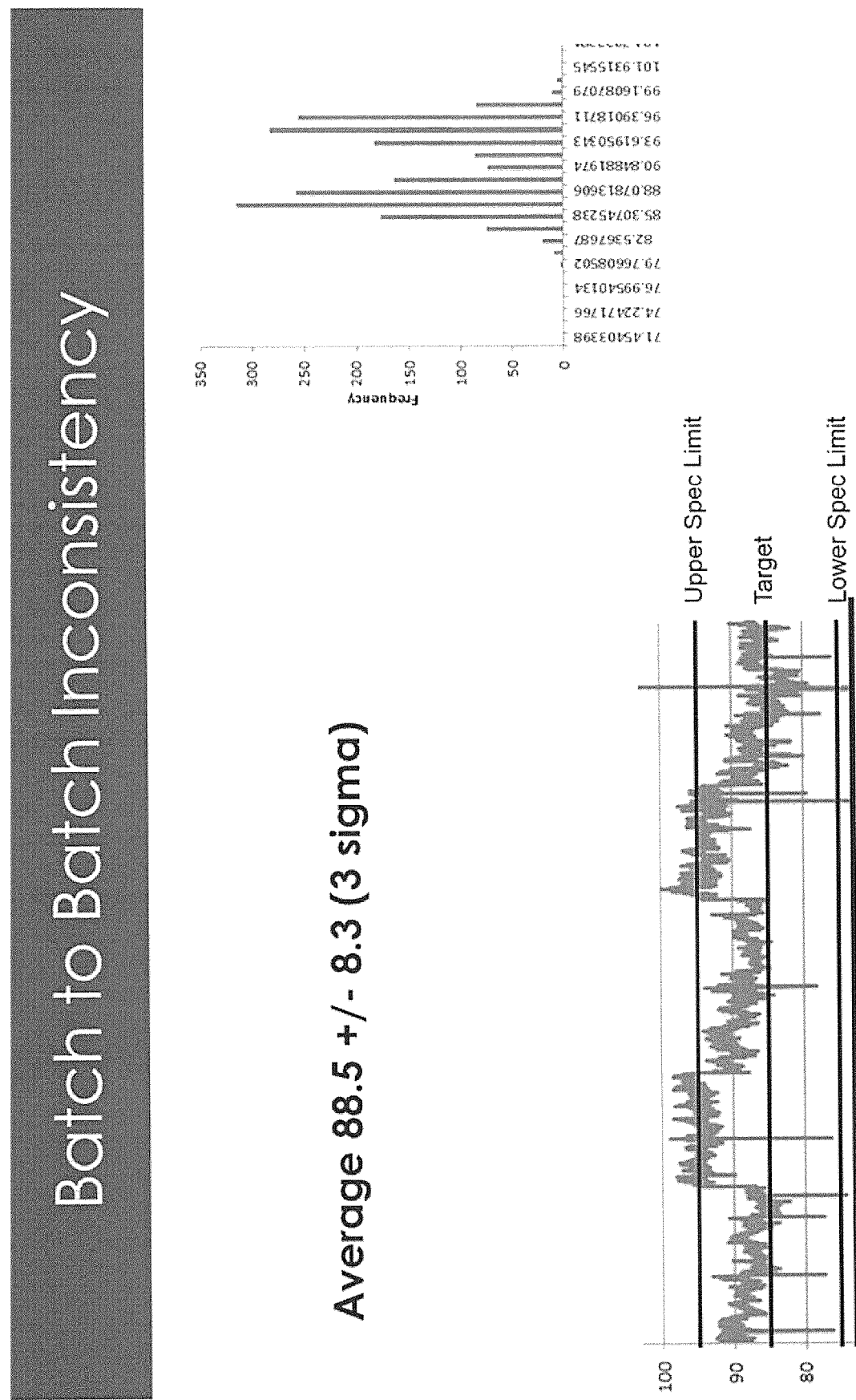
FIG. 8 illustrates a batch-to-batch inconsistency which may benefit from improved process control in accordance with embodiments of the present invention.

FIG. 8 illustrates batch-to-batch inconsistency which may benefit from improved process control.

Figure 9:
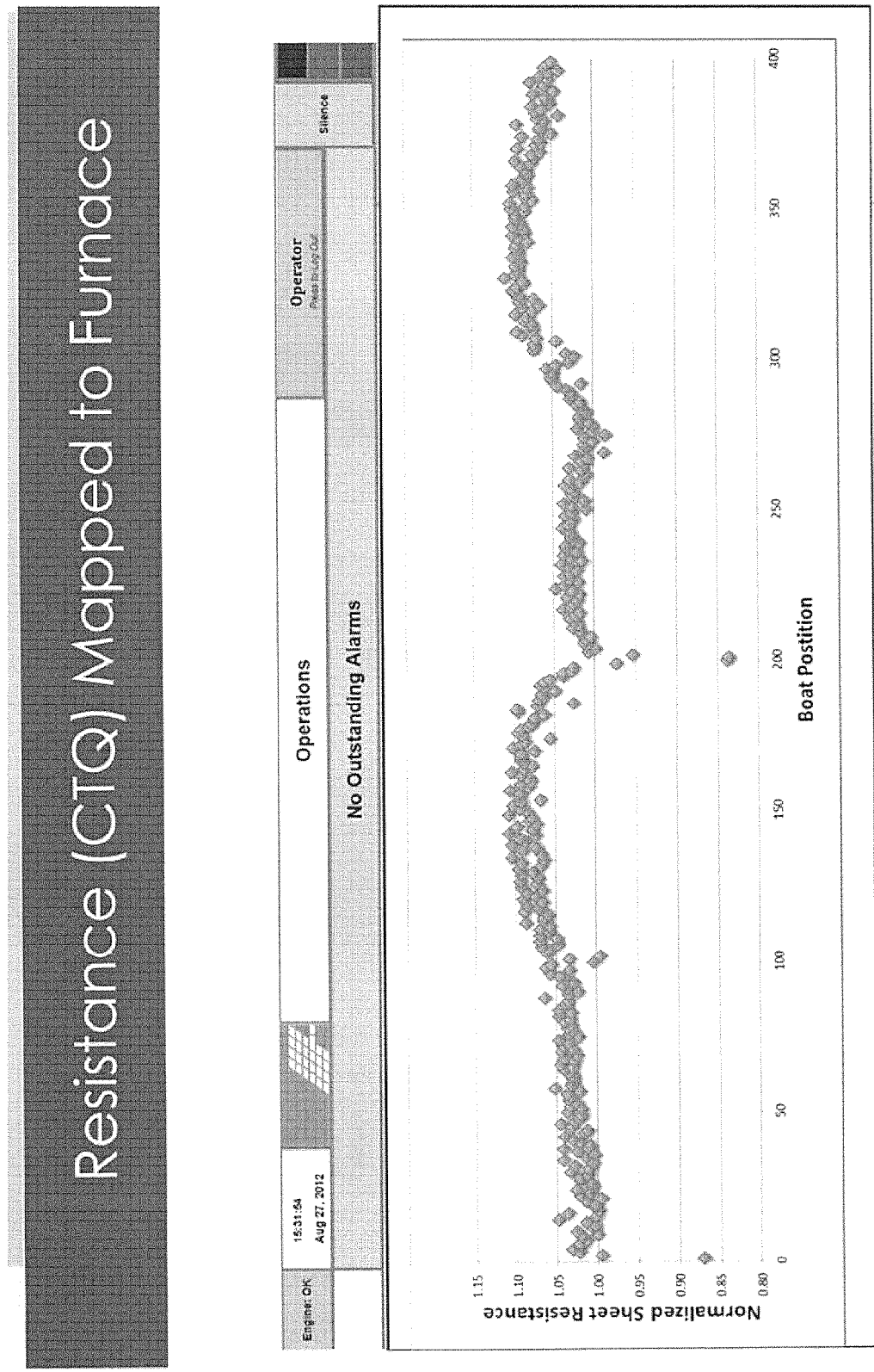
FIG. 9 illustrates sheet resistance measurements of wafers mapped to position within the corresponding furnace tube in accordance with embodiments of the present invention.

FIG. 9 illustrates sheet resistance measurements of wafers mapped to position within the corresponding furnace tube. The illustrated status corresponds to non-fault operation of the furnace tube.

Figure 10:
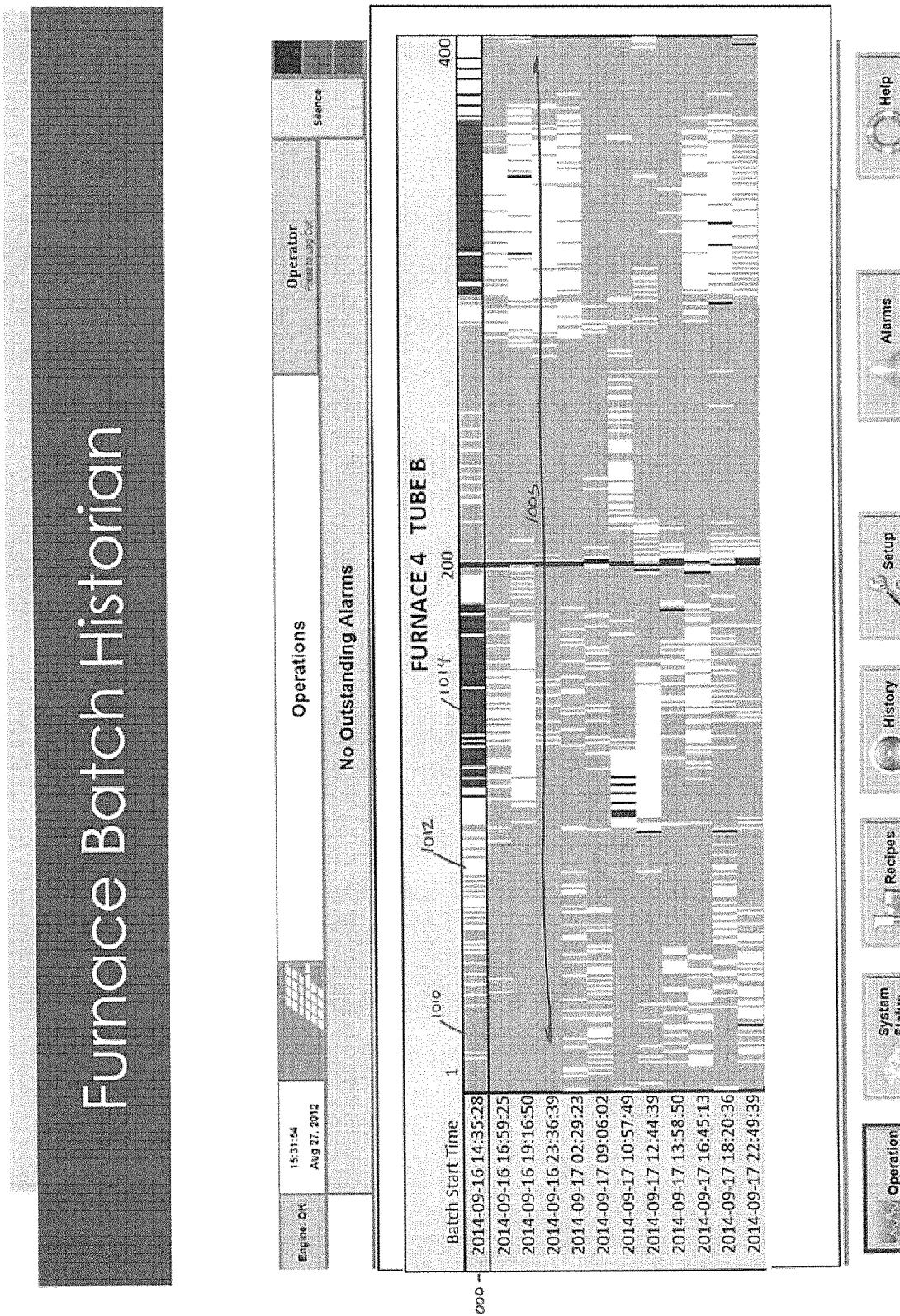
FIGS. 10 to 12 illustrate a historical view of batches from a particular furnace and tube in accordance with embodiments of the present invention.
Figure 11:
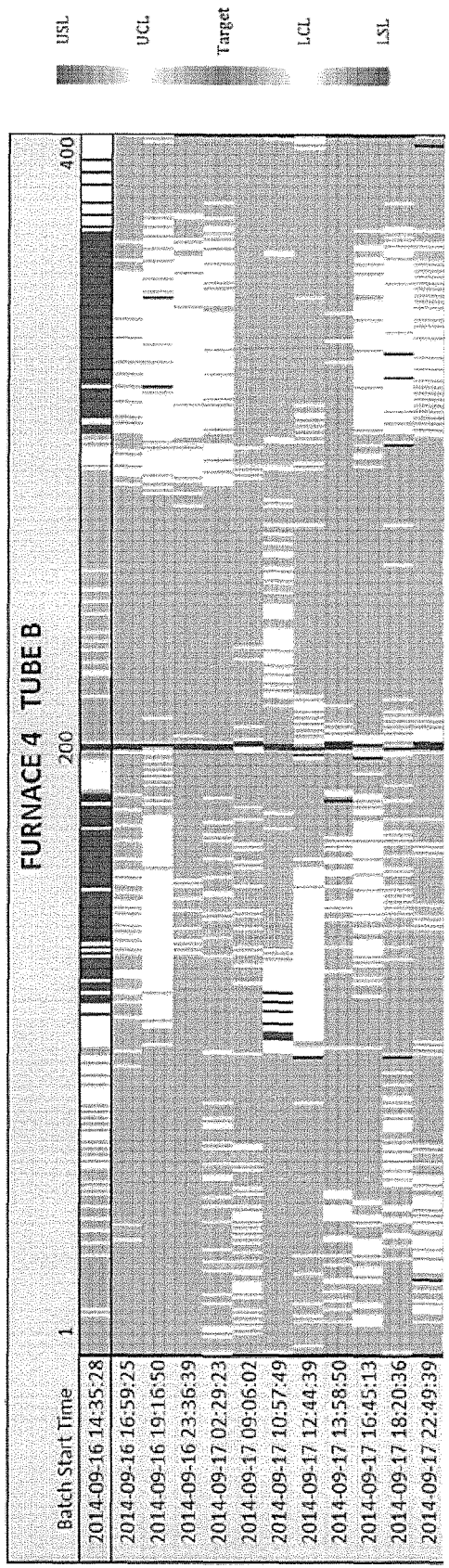
Figure 12:
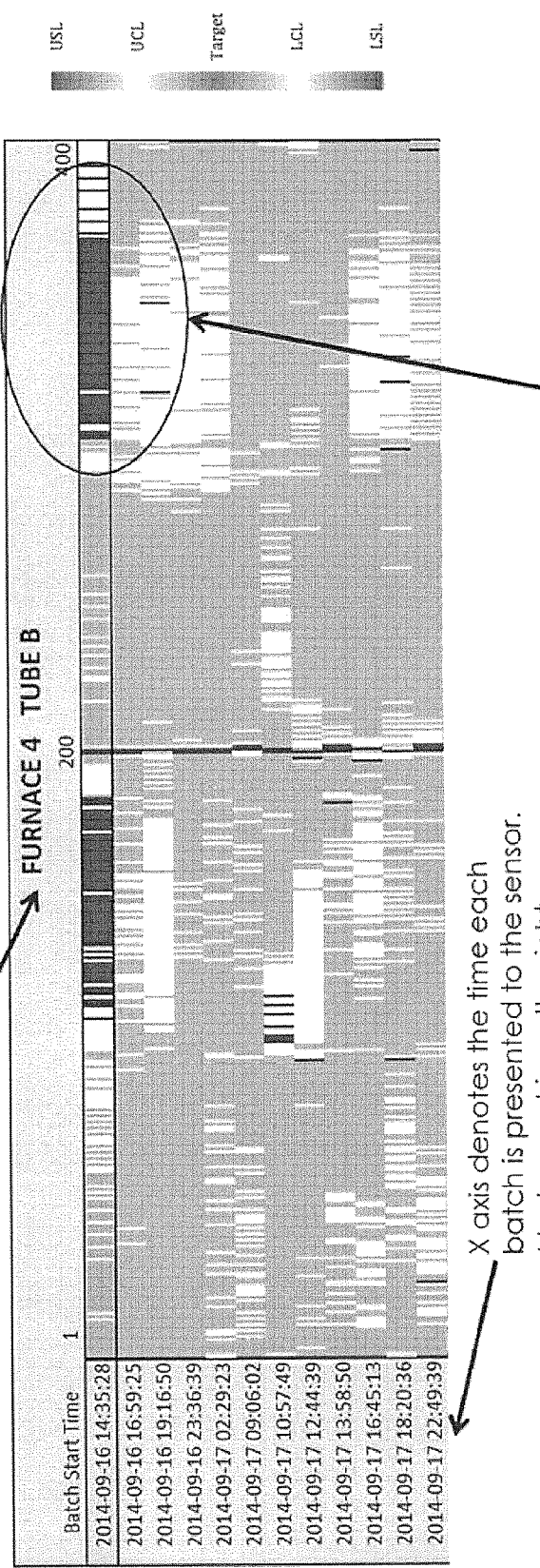

FIGS. 10 to 12 illustrate a historical view of batches from a particular furnace and tube. Each row 1000 of the illustrated graph corresponds to a particular batch in a series, and illustrates whether particular wafers at corresponding positions within the furnace have CTQ parameters within control limits and specification (moderate shading 1010 or green), out of control limits (lightest shading 1012 or yellow), or outside of specification limits (darkest shading 1014 or red). Wafer positions within the tube correspond to variation along the horizontal axis 1005.

Figure 13:
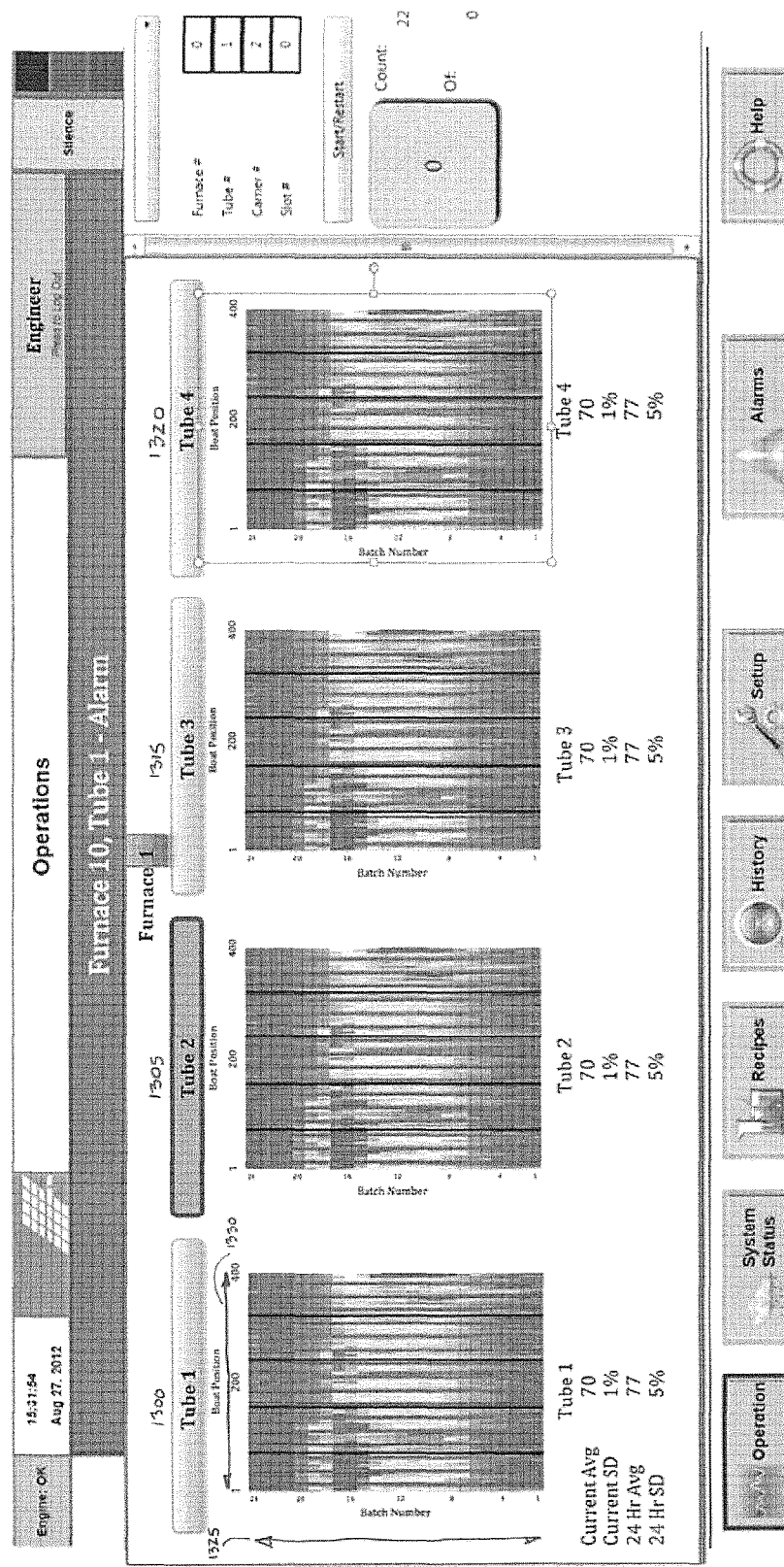
FIG. 13 illustrates a process control screen indicating a furnace overview with four tubes in accordance with embodiments of the present invention.

FIG. 13 illustrates a process control screen indicating a furnace overview with four tubes 1200, 1205, 1215, 1220. For each furnace, status for a plurality of batches and for a plurality of boat positions is displayed. Batch variation corresponds to variation along the vertical axis 1325, and boat position variation corresponds to variation along the horizontal axis 1330.

Figure 14:
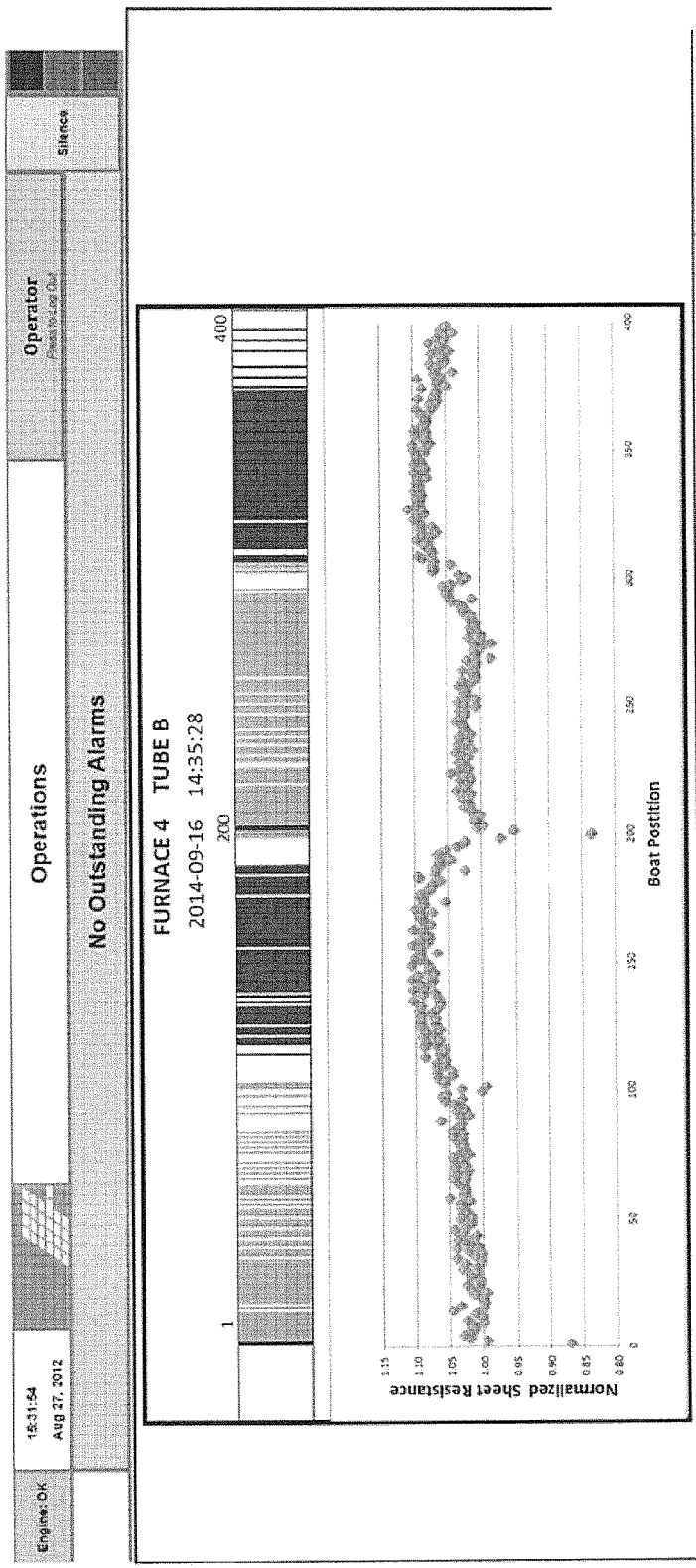
FIG. 14 illustrates a furnace performance diagnostic screen that can be subsequently accessed in accordance with embodiments of the present invention.

FIG. 14 illustrates a furnace performance diagnostic screen that can be subsequently accessed. The details of this screen are similar to those of FIG. 2.

Figure 15:
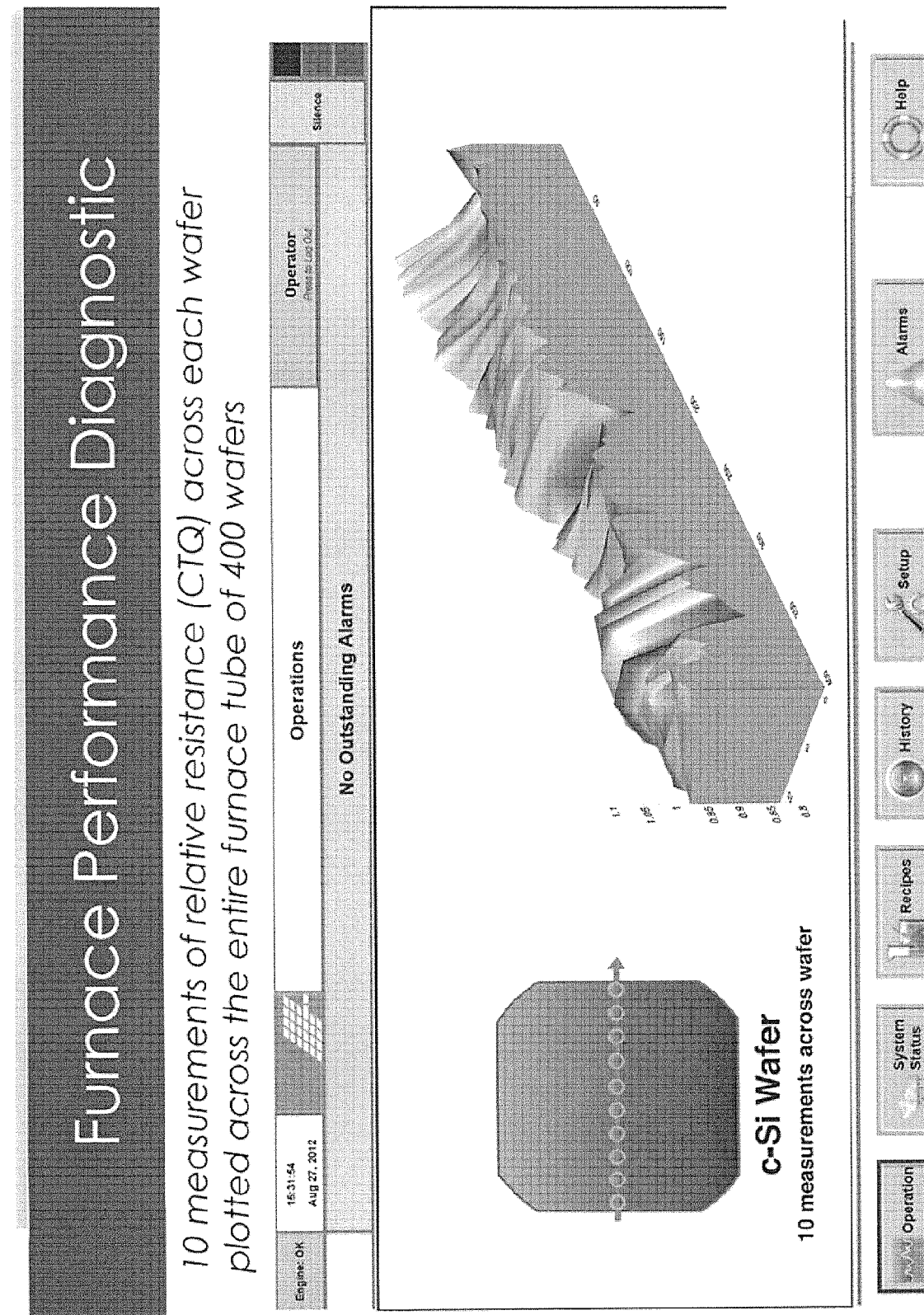
FIG. 15 illustrates a further furnace performance diagnostic screen that can be subsequently accessed in accordance with embodiments of the present invention.

FIG. 15 illustrates a further furnace performance diagnostic screen that can be subsequently accessed. The details of this screen are similar to those of FIGS. 4 and 5.

Figure 16:
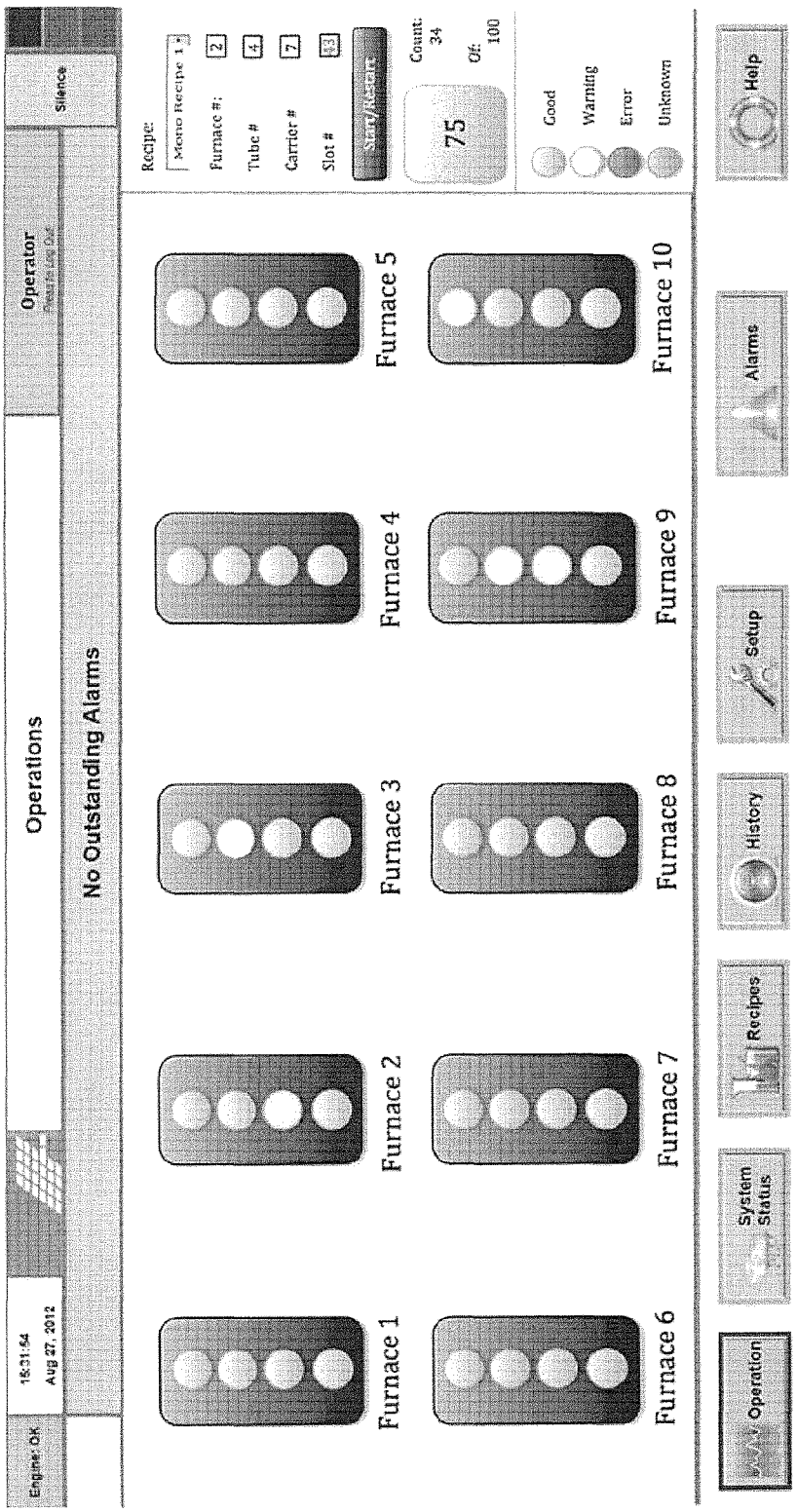
FIG. 16 illustrates an operating screen similar to that of FIG. 1, but without any 'red' alarm lights indicative of a furnace operational issue in accordance with embodiments of the present invention.

FIG. 16 illustrates an operating screen similar to that of FIG. 1, but without any 'red' alarm lights indicative of a furnace operational issue.

Figure 17:
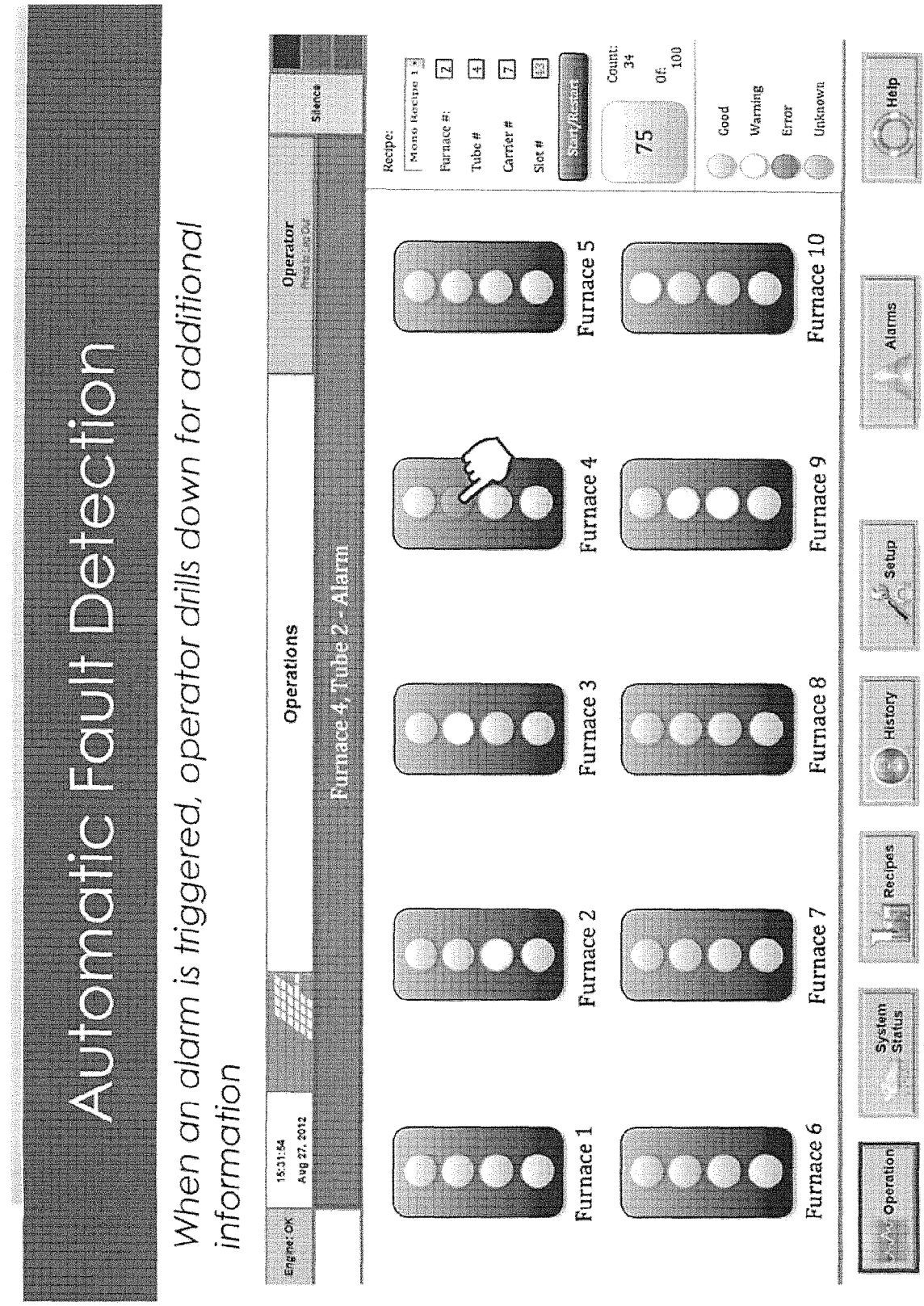
FIG. 17 illustrates the same operating screen but with a 'red' alarm light on furnace 4 at the location corresponding to the "hand" icon, similar to the illustration of FIG. 1 in accordance with embodiments of the present invention.

FIG. 17 illustrates the same operating screen but with a 'red' alarm light on furnace 4 at the location corresponding to the "hand" icon 1600, similar to the illustration of FIG. 1.

Figure 18:
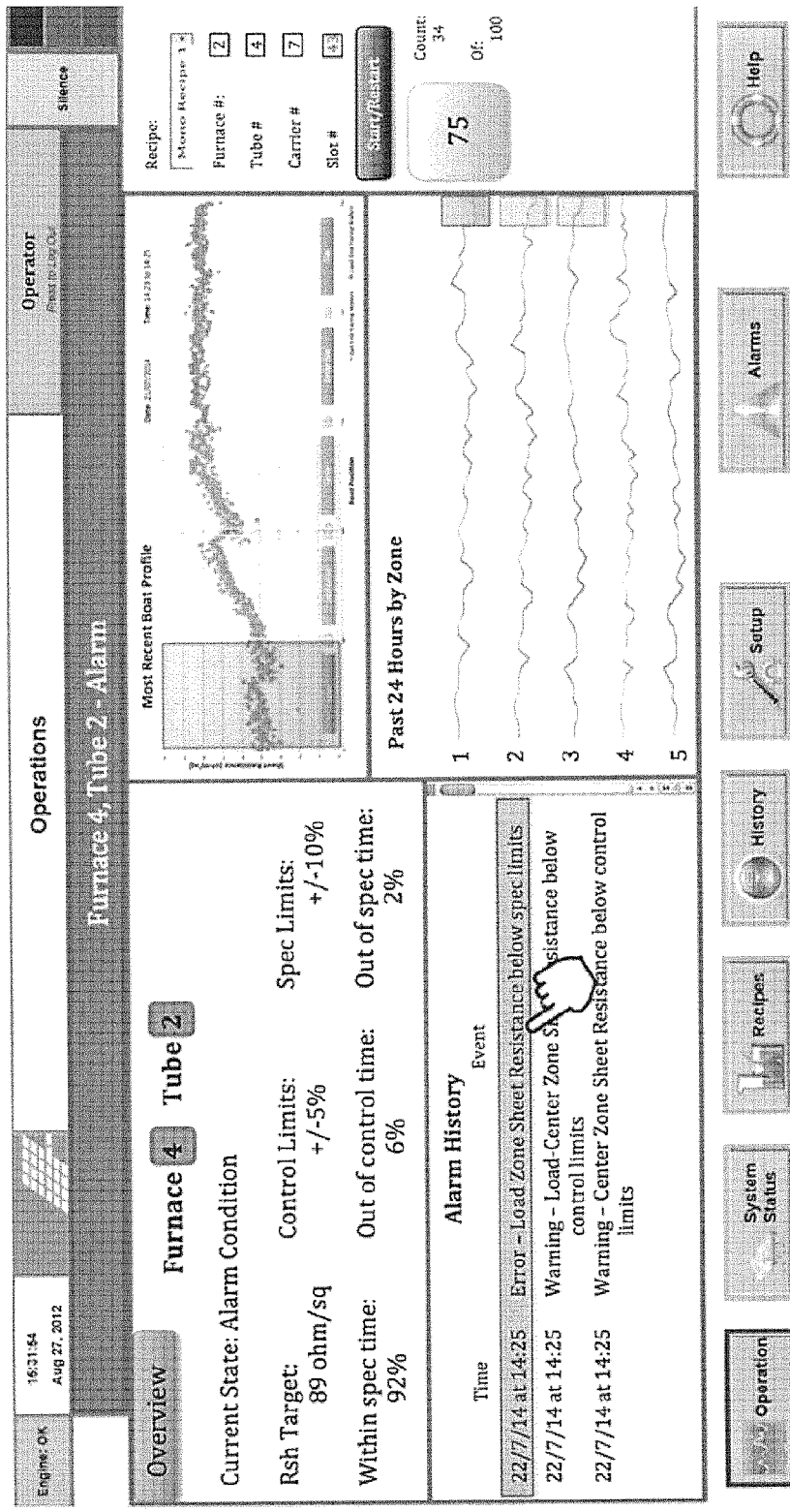
FIG. 18 illustrates an interface screen which may be accessed in response to the above alarm of FIG. 17 in accordance with embodiments of the present invention.

FIG. 18 illustrates an interface screen which may be accessed in response to the above alarm of FIG. 17.

Figure 19:
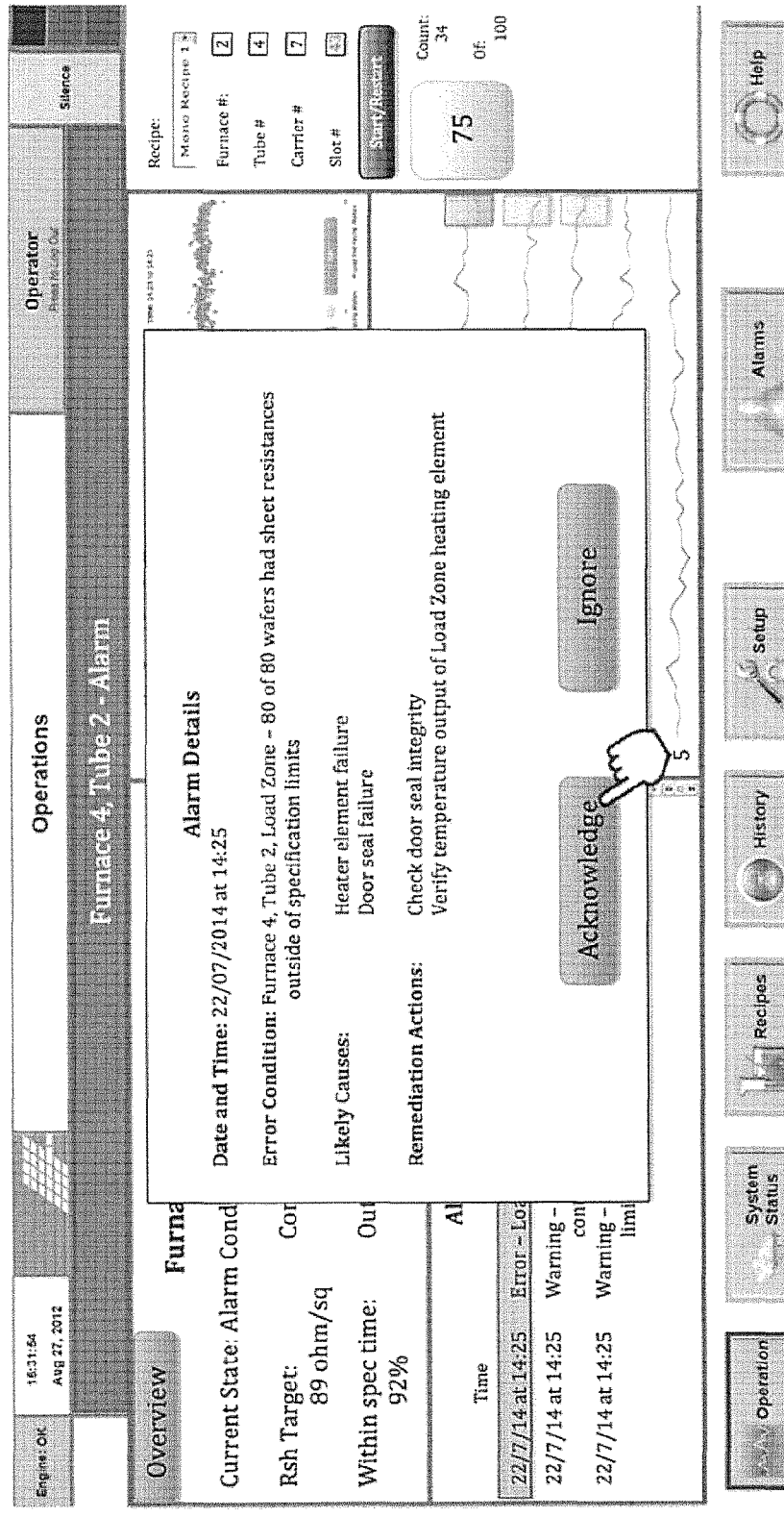
FIG. 19 illustrates a further interface screen whereby an operator can acknowledge a fault in conjunction with corrective action in accordance with embodiments of the present invention.

FIG. 19 illustrates a further interface screen whereby an operator can acknowledge a fault in conjunction with corrective action.

It will be appreciated that, although specific embodiments of the invention have been described herein for purposes of illustration, various modifications may be made without departing from the spirit and scope of the invention. In particular, it is within the scope of the invention to provide a computer program product or program element, or a program storage or memory device such as a solid or fluid transmission medium, magnetic or optical wire, tape or disc, or the like, for storing signals readable by a machine, for controlling the operation of a computer according to the method of the invention and/or to structure some or all of its components in accordance with the system of the invention.

Acts associated with the method described herein can be implemented as coded instructions in a computer program product. In other words, the computer program product is a computer-readable medium upon which software code is recorded to execute the method when the computer program product is loaded into memory and executed on the microprocessor of the wireless communication device.

Acts associated with the method described herein can be implemented as coded instructions in plural computer program products. For example, a first portion of the method may be performed using one computing device, and a second portion of the method may be performed using another computing device, server, or the like. In this case, each computer program product is a computer-readable medium upon which software code is recorded to execute appropriate portions of the method when a computer program product is loaded into memory and executed on the microprocessor of a computing device.

Further, each step of the method may be executed on any computing device, such as a personal computer, server, PDA, or the like and pursuant to one or more, or a part of one or more, program elements, modules or objects generated from any programming language, such as C++, Java, PL/1, or the like. In addition, each step, or a file or object or the like implementing each said step, may be executed by special purpose hardware or a circuit module designed for that purpose.

It is obvious that the foregoing embodiments of the invention are examples and can be varied in many ways. Such present or future variations are not to be regarded as a departure from the spirit and scope of the invention, and all such modifications as would be obvious to one skilled in the art are intended to be included within the scope of the following claims.

We claim:

1. A method for quality monitoring during production of silicon cells for use in photovoltaic products, the method comprising:
    measuring characteristics of plural silicon wafers following production operations, the production operations corresponding to treatment by a production tool for carrying out a particular production step;
    determining a spatial positioning of the silicon wafers within the production tool during treatment, the spatial positioning being a positioning of the silicon wafers relative to one another; and
    providing a graphical display of information generated based on the measured characteristics of the silicon wafers, the information spatially arranged on the graphical display according to the spatial positioning.

2. The method according to claim 1, wherein the information generated based on the measured characteristics of the silicon wafers is indicative of spatial variation, temporal variation, or both spatial and temporal variation in one or more operating characteristics of the production tool.

3. The method according to claim 1, further comprising correlating the measured characteristics of the silicon wafers with one or both of:
    processing time of the silicon wafers within the production tool; and
    processing location of the silicon wafers within the production tool, to provide an indication of spatial variation, temporal variation, or both spatial and temporal variation of the measured characteristics with respect to operation of the production tool.

4. The method according to claim 3, further comprising displaying an indication of at least one of the processing time or the processing location.

5. The method according to claim 1, wherein the production tool is a batch production tool or an inline production tool.

6. The method according to claim 1, wherein the production tool is a batch diffusion furnace, an anti-reflective coating tool, or a wet chemistry system.

7. The method according to claim 1, further comprising tracking the silicon wafers through a plurality of the production operations, the tracking including providing, for each of the silicon wafers, an indication of a history of production tools used to process each of the silicon wafers, and an indication of the spatial order, temporal order, or both spatial order and temporal order of each of the silicon wafers within the production tool during treatment.

8. The method according to claim 1, wherein the characteristics of the wafers correspond to Critical to Quality (CTQ) parameters indicative of quality of production of the silicon wafers.

9. A method for quality monitoring during production of silicon cells for use in photovoltaic products, the method comprising:
- measuring characteristics of plural silicon wafers following production operations, the production operations corresponding to treatment by a production tool for carrying out a particular production step;
- determining a spatial positioning, temporal order, or both spatial positioning and temporal order of the silicon wafers within the production tool during treatment, the spatial positioning being a positioning of the silicon wafers relative to one another; and
- providing a graphical display of information generated based on the measured characteristics of the silicon wafers, the information spatially arranged on the graphical display according to the spatial positioning, temporal order, or both spatial positioning and temporal order:
- correlating the measured characteristics of the silicon wafers with one or both of: processing time of the silicon wafers within the production tool; and processing location of the silicon wafers within the production tool, to provide an indication of spatial variation, temporal variation, or both spatial and temporal variation of the measured characteristics with respect to operation of the production tool; and
- displaying a variation of performance of the production tool with respect to locations of the production tool capable of holding the plural silicon wafers simultaneously during a batch processing operation, the variation of performance based on the indication of spatial variation of the measured characteristics with respect to operation of the production tool.

10. A method for quality monitoring during production of silicon cells for use in photovoltaic products, the method comprising:
- measuring characteristics of plural silicon wafers following production operations, the production operations corresponding to treatment by a production tool for carrying out a particular production step;
- determining a spatial positioning, temporal order, or both spatial positioning and temporal order of the silicon wafers within the production tool during treatment, the spatial positioning being a positioning of the silicon wafers relative to one another; and
- providing a graphical display of information generated based on the measured characteristics of the silicon wafers, the information spatially arranged on the graphical display according to the spatial positioning, temporal order, or both spatial positioning and temporal order;
- correlating the measured characteristics of the silicon wafers with one or both of: processing time of the silicon wafers within the production tool; and processing location of the silicon wafers within the production tool, to provide an indication of spatial variation, temporal variation, or both spatial and temporal variation of the measured characteristics with respect to operation of the production tool; and
- determining operating characteristics of the production tool based on variation of the measured characteristics with respect to the spatial positioning, temporal order, or both spatial positioning and temporal order of the silicon wafers within the production tool during treatment.

11. A system for quality monitoring during production of silicon cells for use in photovoltaic products, the system comprising:
- a wafer measurement module configured to measure characteristics of plural silicon wafers following production operations, the production operations corresponding to treatment by a production tool for carrying out a particular production step;
- a wafer tracking module configured to determine a spatial positioning of the silicon wafers within the production tool during treatment, the spatial positioning being positioning of the silicon wafers relative to one another; and
- an operator interface module configured to provide a graphical display of information based on the measured characteristics of the silicon wafers, the information spatially arranged on the graphical display according to the spatial positioning.

12. The system according to claim 11, wherein the information generated based on the measured characteristics of the silicon wafers is indicative of spatial variation, temporal variation, or both spatial and temporal variation in one or more operating characteristics of the production tool.

13. The system according to claim 11, further comprising a production performance monitoring module configured to correlate the measured characteristics of the silicon wafers with one or both of:
- processing time of the silicon wafers within the production tool; and
- processing location of the silicon wafers within the production tool, to provide an indication of spatial variation, temporal variation, or both spatial and temporal variation of the measured characteristics with respect to operation of the production tool.

14. The system according to claim 13, wherein the operator interface module is further configured to display an indication of at least one of the processing time or the processing location.

15. The system according to claim 11, wherein the production tool is a batch production tool or an inline production tool.

16. The system according to claim 11, wherein the production tool is a batch diffusion furnace, an anti-reflective coating tool, or a wet chemistry system.

17. The system according to claim 11, wherein the wafer tracking module is further configured to track the silicon wafers through a plurality of the production operations, the tracking including providing, for each of the silicon wafers, an indication of a history of production tools used to process each of the silicon wafers, and an indication of the spatial order, temporal order, or both spatial order and temporal order of the one of the silicon wafers within the production tool during treatment.

18. The system according to claim 11, wherein the characteristics of the wafers correspond to Critical to Quality (CTQ) parameters indicative of quality of production of the silicon wafers.

19. A system for quality monitoring during production of silicon cells for use in photovoltaic products, the system comprising:
 a wafer measurement module configured to measure characteristics of plural silicon wafers following production operations, the production operations corresponding to treatment by a production tool for carrying out a particular production step;
 a wafer tracking module configured to determine a spatial positioning, temporal order, or both spatial positioning and temporal order of the silicon wafers within the production tool during treatment, the spatial positioning being positioning of the silicon wafers relative to one another; and
 an operator interface module configured to provide a graphical display of information based on the measured characteristics of the silicon wafers, the information spatially arranged on the graphical display according to the spatial positioning, temporal order, or both spatial positioning and temporal order, wherein the operator interface module is further configured to display a variation of performance of the production tool with respect to locations of the production tool capable of holding the plural silicon wafers simultaneously during a batch processing operation, the variation of performance based on the indication of spatial variation of the measured characteristics with respect to operation of the production tool; and
 a production performance monitoring module configured to correlate the measured characteristics of the silicon wafers with one or both of: processing time of the silicon wafers within the production tool; and processing location of the silicon wafers within the production tool, to provide an indication of spatial variation, temporal variation, or both spatial and temporal variation of the measured characteristics with respect to operation of the production tool.

20. A system for quality monitoring during production of silicon cells for use in photovoltaic products, the system comprising:
 a wafer measurement module configured to measure characteristics of plural silicon wafers following production operations, the production operations corresponding to treatment by a production tool for carrying out a particular production step;
 a wafer tracking module configured to determine a spatial positioning, temporal order, or both spatial positioning and temporal order of the silicon wafers within the production tool during treatment, the spatial positioning being positioning of the silicon wafers relative to one another; and
 an operator interface module configured to provide a graphical display of information based on the measured characteristics of the silicon wafers, the information spatially arranged on the graphical display according to the spatial positioning, temporal order, or both spatial positioning and temporal order; and
 a production performance monitoring module configured to correlate the measured characteristics of the silicon wafers with one or both of: processing time of the silicon wafers within the production tool; and processing location of the silicon wafers within the production tool, to provide an indication of spatial variation, temporal variation, or both spatial and temporal variation of the measured characteristics with respect to operation of the production tool, wherein the production performance monitoring module is configured to determine operating characteristics of the production tool based on variation of the measured characteristics with respect to the spatial positioning, temporal order, or both spatial positioning and temporal order of the silicon wafers within the production tool during treatment.

21. A method for quality monitoring during production of silicon cells for use in photovoltaic products, the method comprising:
 measuring parameters of plural silicon wafers following production operations, the production operations corresponding to treatment by a production tool for carrying out a particular production step;
 correlating the measured parameters of each of the silicon wafers with a time of treatment by the production tool, a corresponding location of each of the silicon wafers within the production tool during treatment, or a combination thereof;
 correlating the measured parameters of each of the silicon wafers with aspects of the production operations, the aspects including one or both of processing time and processing location within the production tool, thereby determining operating characteristics of the production tool; and
 displaying the determined operating characteristics of the production tool for use in quality monitoring.

22. The method according to claim 21, wherein the production tool is a batch production tool or an inline production tool.

23. A system for quality monitoring during production of silicon cells for use in photovoltaic products, the system comprising:
 a wafer measurement module configured to measure parameters of plural silicon wafers following production operations, the production operations corresponding to treatment by a production tool for carrying out a particular production step;
 a wafer tracking module configured to correlate the parameters of each of the silicon wafers with a time of treatment by the production tool, a corresponding location of each of the silicon wafers within the production tool during treatment, or a combination thereof;
 a production performance monitoring module configured to correlate the measured parameters of each of the silicon wafers with aspects of the production operations, the aspects including one or both of processing time and processing location within the production tool, thereby determining operating characteristics of the production tool; and
 an operator interface module configured to display the determined operating characteristics of the production tool for use in quality monitoring.

24. The system according to claim 23, wherein the production tool is a batch production tool or an inline production tool.

* * * * *